(12) United States Patent
Ikarashi (10) Patent No.: US 7,529,122 B2
(45) Date of Patent: May 5, 2009

(54) STORAGE ELEMENT AND MEMORY

(75) Inventor: Minoru Ikarashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 16 days.

(21) Appl. No.: 11/872,370

(22) Filed: Oct. 15, 2007

(65) Prior Publication Data

US 2008/0112215 A1 May 15, 2008

(30) Foreign Application Priority Data

Nov. 2, 2006 (JP) .................... P2006-299525

(51) Int. Cl.
*G11C 11/15* (2006.01)
(52) U.S. Cl. ...................... 365/158; 365/173
(58) Field of Classification Search .......... 365/32, 365/55, 66
See application file for complete search history.

(56) References Cited

U.S. PATENT DOCUMENTS

| | | | |
|---|---|---|---|
| 5,695,864 A | 12/1997 | Slonczewski | |
| 5,920,500 A | 7/1999 | Tehrani et al. | |
| 6,396,735 B2 * | 5/2002 | Michijima et al. | .......... 365/173 |
| 2003/0072174 A1 | 4/2003 | Savtchenko et al. | |
| 2006/0141640 A1 | 6/2006 | Huai | |

FOREIGN PATENT DOCUMENTS

| | | |
|---|---|---|
| JP | 10-116490 | 5/1998 |
| JP | 2003-17782 | 1/2003 |
| JP | 2005-277147 | 10/2005 |

OTHER PUBLICATIONS

Nahas et al., "A 4Mb 0.18 μm 1T1MTJ Toggle MRAM Memory," IEEE/ISSCC 2004 Visulas Supplement, p. 22.

* cited by examiner

*Primary Examiner*—Tan T. Nguyen
(74) *Attorney, Agent, or Firm*—K & L Gates LLP (57) ABSTRACT

A storage element and memory are provided. The storage element includes a storage layer that stores information based on a magnetic state of a magnetic material; and a fixed magnetization layer a magnetization direction of which is fixed and which is provided for the storage layer with a nonmagnetic layer in between. Information is recorded in the storage layer by applying a current in a stacking direction to change the magnetization direction of the storage layer. The fixed magnetization layer includes a plurality of ferromagnetic layers that are stacked with nonmagnetic layers in between, and the fixed magnetization layer includes magnetization regions having magnetic components in the stacking direction and magnetizations in respectively opposite directions. The magnetization regions are formed at both ends of at least one ferromagnetic layer that is disposed closest to the storage layer out of the plurality of ferromagnetic layers.

5 Claims, 6 Drawing Sheets

STORAGE ELEMENT AND MEMORY

CROSS REFERENCES TO RELATED APPLICATIONS

The present application claims priority to Japanese Patent Application JP 2006-299525 filed in the Japanese Patent Office on Nov. 2, 2006, the entire contents of which is being incorporated herein by reference.

BACKGROUND

The present application relates to a storage element including a storage layer, in which a magnetization state of a magnetic material is stored as information, and a fixed magnetization layer, a magnetization direction of which is fixed, where the magnetization direction of the storage layer can be changed by applying a current. The present application also relates to a memory including such storage element, and can be favorably applied to a nonvolatile memory.

Apparatuses that carry out information communication, in particular, small-scale user appliances such as personal digital assistants have been widely used and the request for improved performance, such as higher integration, faster operation, and reduced power consumption has been made for elements such as memory and logic circuits constituting such appliances.

In particular, nonvolatile memory may be an essential component for improving the performance of appliances.

In the field of nonvolatile memory, various technologies such as semiconductor flash memory and FeRAM (Ferroelectric Random Access Memory) have already been commercialized, with research and development also being conducted to achieve even higher performance.

As a new type of nonvolatile memory that uses magnetic material, much attention has been drawn to the field of MRAM (Magnetic Random Access Memory) that uses a tunnel magnetoresistive effect. Such technology has advanced rapidly in recent years (see, for example, J. Nahas et al., IEEE/ISSCC 2004 Visulas Supplement, p.22).

MRAM includes small storage elements regularly arranged that record information and wiring, such as word lines and bit lines, so that each element can be accessed.

The respective magnetic memory elements each include a storage layer in which information is stored as the magnetization direction of a ferromagnetic material.

Each magnetic memory element uses a magnetic tunnel junction (MTJ) including the storage layer mentioned above, a tunnel insulating film (a nonmagnetic spacer film), and a fixed magnetization layer the magnetization direction of which is fixed. The magnetization direction of the fixed magnetization layer can be fixed by providing an antiferromagnetic layer, for example.

With this construction, since the "tunnel magnetoresistive effect" with which the resistance to a tunnel current flowing in the tunnel insulating film changes based on the angle between the magnetization direction of the storage layer and the magnetization direction of the fixed magnetization layer is generated, information can be written (recorded) using this tunnel magnetoresistive effect. The magnitude of such resistance is maximized when the magnetization direction of the storage layer and the magnetization direction of the fixed magnetization layer are antiparallel and is minimized when the directions are parallel.

For a magnetic memory element with this construction, information can be recorded (written) into the magnetic memory element by controlling the magnetization direction of the storage layer in the magnetic memory element using a combined current magnetic field generated by applying currents to both a word line and a bit line. In a typical construction, different magnetization directions (or "magnetization states") are stored corresponding to "0" information and "1" information.

Japanese Unexamined Patent Application Publication No. H10-116490, for example, discloses a method of recording (writing) information into a storage element using asteroid characteristics and US Patent Application Publication No. 2003/0072174, for example, discloses a method of recording (writing) information into a storage element using switching characteristics.

On the other hand, recorded information can be read by selecting a memory cell via an element such as a transistor and using the tunnel magnetoresistive effect of the magnetic memory element to detect any difference in the magnetization direction of the storage layer as a voltage signal, thereby detecting the recorded information.

Compared to other nonvolatile memory, the main characteristic of MRAM is that since "0" information and "1" information are rewritten by reversing the magnetization direction of the storage layer formed of ferromagnetic material, information can be rewritten at high speed and almost infinitely (i.e., over $10^{15}$ times).

However, since it may be necessary to generate a comparatively large current magnetic field to rewrite recorded information in an MRAM, it may require to supply a large current (for example, from several mA to several tens of mA) to the address wires. This results in higher power consumption.

Also, since both write address wires and read address wires may be required in an MRAM, it has been difficult to miniaturize the structure of memory cells. Also, when elements are miniaturized, the address wires become finer, which makes it difficult to supply a sufficient current, and since the required current magnetic field increases due to the increase in coercivity, there is increased power consumption.

Accordingly, the elements in an MRAM have been difficult to miniaturize.

Research has been carried out into constructions that record information without using a current magnetic field. Among such constructions, U.S. Pat. No. 5,695,864, for example, discloses memories that use magnetization reversal by spin transfer so that the magnetization can be reversed using a smaller current.

Japanese Unexamined Patent Application Publication No. 2003-17782 discloses magnetization reversal by spin transfer where spin-polarized electrons that have passed through a magnetic material are injected into another magnetic material, thereby causing magnetization reversal in this other magnetic material.

That is, when spin-polarized electrons that have passed a magnetic layer a magnetization direction of which is fixed (i.e., a "fixed magnetization layer") are injected into another magnetic layer a magnetization direction of which is not fixed (i.e., a "free magnetization layer"), torque is applied to the magnetization of the free magnetization layer. Once a current of a given threshold or greater is applied, the magnetization direction of the magnetic layer (i.e., the free magnetization layer) can be reversed.

For example, by applying a current in a direction that is perpendicular to the film surface, of a giant magnetoresistive element (GMR element) and/or a magnetic tunnel junction element (MTJ element) with a free magnetization layer and a fixed magnetization layer, it will be possible to reverse the magnetization direction of at least some of the elements.

In this way, by forming a storage element with a fixed magnetization layer and a free magnetization layer (storage layer) and changing the polarity of a current flowing to the storage element, the magnetization direction of the storage layer is reversed, thereby switching (rewriting) between "0" information and "1" information.

Recorded information can be read using the tunnel magnetoresistive effect in the same way as with an MRAM by providing a tunnel insulating layer between the fixed magnetization layer and the free magnetization layer (storage layer).

Magnetization reversal by spin transfer has an advantage in that even when the elements are miniaturized, it is possible to achieve magnetization reversal without increasing the current.

The absolute value of the current supplied to a storage element to achieve magnetization reversal is 1 mA or below for a storage element of a scale of around 0.1 µm, for example, and also falls in proportion to the volume of the storage element, which is advantageous for scaling.

In addition, since word lines for recording that were required in an MRAM may be unnecessary, there is a further advantage that the construction of memory cells is simplified.

Hereinafter, a storage element that uses spin transfer is referred to as an "SpRAM" (Spin transfer Random Access Memory) and a spin polarizing electron flow that causes spin transfer is referred to as a "spin injection current".

There are great expectations on SpRAM as nonvolatile memory that is capable of lower power consumption and increased capacity while maintaining MRAM's advantages of high speed and of being rewritable an almost infinite number of times.

Figure 1:
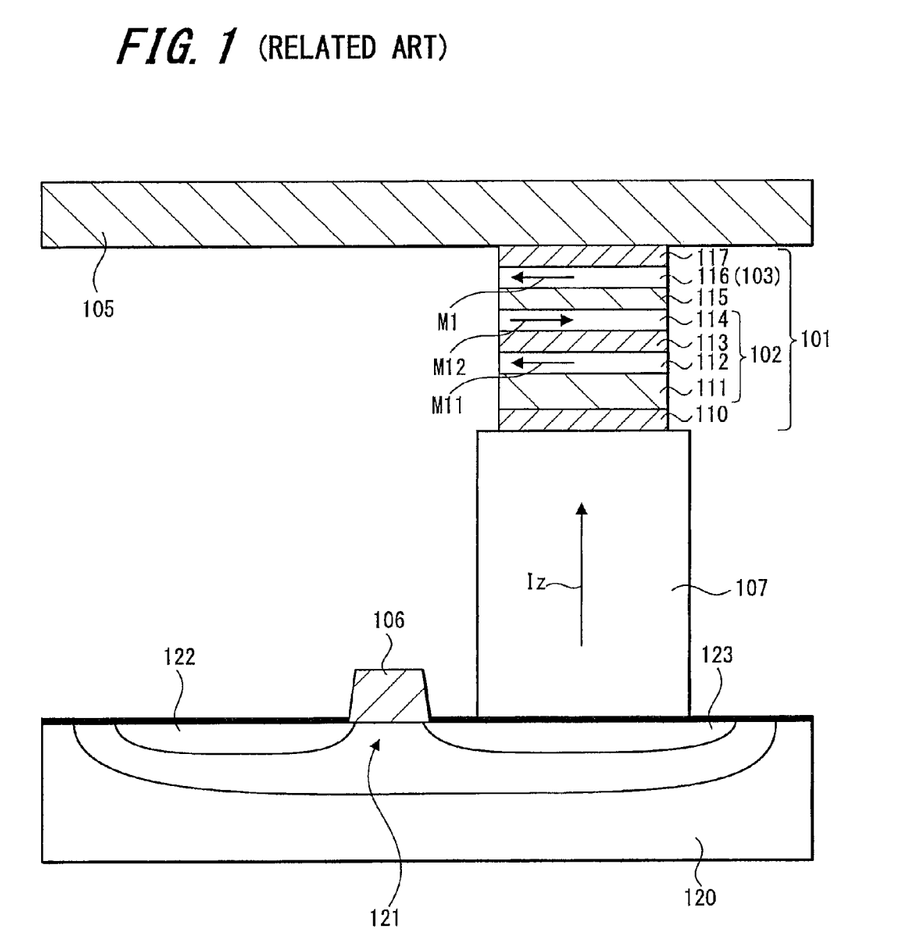
FIG. 1 is a schematic cross-sectional view of a memory cell in a memory that uses spin transfer according to related art.

FIG. 1 shows a schematic cross-sectional view of a memory cell of a memory (SpRAM) that uses spin transfer according to related art.

To read information recorded in a memory cell, a diode, a MOS transistor, or the like is used to electrically select the memory cell. The memory cell shown in FIG. 1 uses a MOS transistor.

First, the construction of a storage element 101 that forms a memory cell of an SpRAM will be described.

A ferromagnetic layer 112 and a ferromagnetic layer 114 are antiferromagnetically coupled by disposing a nonmagnetic layer 113 in between. In addition, the lower ferromagnetic layer 112 is disposed in contact with an antiferromagnetic layer 111, and due to exchange interaction that acts between such layers, has strong unidirectional magnetic anisotropy. A fixed magnetization layer 102 is formed of these four layers 111, 112, 113, and 114. That is, the fixed magnetization layer 102 includes two ferromagnetic layers 112, 114.

A ferromagnetic layer 116 is formed so that the magnetization direction M1 thereof is comparatively easy to rotate. This ferromagnetic layer 116 forms a storage layer (free magnetization layer) 103. A tunnel insulating layer 115 is formed between the ferromagnetic layer 114 of the fixed magnetization layer 102 and the ferromagnetic layer 116, that is, between the fixed magnetization layer 102 and the storage layer (free magnetization layer) 103. The tunnel insulating layer 115 breaks the magnetic coupling between the magnetic layers 116 and 114 thereabove and therebelow and also transmits a tunnel current. In this way, a TMR (tunnel magnetoresistive effect) element is formed including the fixed magnetization layer 102 that is a magnetic layer with a fixed magnetization direction, the tunnel insulating layer 115, and the storage layer (free magnetization layer) 103 a magnetization direction of which can be changed.

In addition, the layers 111 to 116 described above, a base film 110, and a top coat layer 117 constitute a storage element 101 including a TMR element.

A selecting MOS transistor 121 is formed in a silicon substrate 120 and a connection plug 107 is formed on one diffused layer 123 of the selecting MOS transistor 121. The base film 110 of the storage element 101 is connected to this connection plug 107. Although not shown, the other diffused layer 122 of the selecting MOS transistor 121 is connected to a sense line via a connection plug. The gate 106 of the selecting MOS transistor is connected to a selection signal line.

The top coat layer 117 of the storage element 101 is connected to a bit line (BL) 105 disposed thereupon.

In a normal state, due to the strong antiferromagnetic coupling via the nonmagnetic layer 113, the magnetization M11 of the ferromagnetic layer 112 and the magnetization M12 of the ferromagnetic layer 114 are almost completely antiparallel.

Since the ferromagnetic layer 112 and the ferromagnetic layer 114 are constructed so that the product of film thickness and saturation magnetization is equal, the leaked component of the pole magnetic field is so small as to be negligible.

The resistance of the TMR element including the layers 114, 115, 116 changes based on whether the direction of magnetization M1 of the ferromagnetic layer 116 of the storage layer 103 and the direction of magnetization M12 of the ferromagnetic layer 114 of the fixed magnetization layer 102 on both sides of the tunnel insulating layer 115 are parallel or antiparallel. When the magnetizations M1, M12 are parallel, the resistance decreases, while when the magnetizations M1, M12 are antiparallel, the resistance increases. If the resistance of the TMR element (the layers 114, 115, 116) changes, the resistance of the entire storage element 101 will also change. By using such change, it is possible to both record information and to read recorded information. That is, by assigning the low resistance state to "0" information and the high resistance state to "1" information, for example, it is possible to record (one bit of) binary information.

Note that since the ferromagnetic layer 114 that is closest to the storage layer 103 out of the layers in the fixed magnetization layer 102 serves as a reference for the direction of the magnetization M1 of the storage layer 103 during the reading of recorded information, this ferromagnetic layer 114 is also referred to as the "reference layer". To rewrite information of a memory cell or to read the information that has been recorded in a memory cell, it is necessary to supply a spin injection current Iz. This spin injection current Iz passes through the storage element 101, the diffused layer 123, and the bit line 105.

By changing the polarity of the spin injection current Iz, it is possible to change the spin injection current Iz that flows through the storage element 101 from upward to downward or from downward to upward. By doing so, it is possible to change the direction of the magnetization M1 of the storage layer 103 of the storage element 101, thereby rewriting the information in the memory cell.

Japanese Unexamined Patent Application Publication No. 2005-277147 discloses an SpRAM where the direction of magnetization of the storage layer of the storage element is reversed by applying a spin injection current to the storage element and also applying a bias current magnetic field to the storage element.

More specifically, for the construction shown in FIG. 1 for example, the spin injection current Iz is applied to the storage element 101 via the bit line 105 and a bias current magnetic field Hx (not shown) produced by the current (which is equal to the spin injection current Iz) flowing through the bit line 105 is also applied to the storage layer 103 of the storage element 101. By doing so, the direction of the magnetization M1 of the storage layer 103 can be efficiently changed.

Hereinafter, a diagram in which the state of a memory cell is expressed with the spin injection current Iz on the vertical axis and the bias current magnetic field Hx on the horizontal axis is referred to as a "phase diagram". Note that in the case where the spin injection current Iz and the bias current that produces the bias current magnetic field Hx are pulse currents, a phase diagram is produced using the crest value of the pulse currents.

For the storage element 101 shown in FIG. 1, the magnitude of the spin torque that acts upon the magnetization $M_{free}$ (=M1) of the storage layer (free magnetization layer) 103 is proportional to the vector triple product $M_{free} \times M_{free} \times M_{ref}$. Here, $M_{ref}$ is the magnetization (=M12) of the reference layer (ferromagnetic layer) 114.

Since the magnetization $M_{free}$ of the storage layer (free magnetization layer) 103 and the $M_{ref}$ of the reference layer (ferromagnetic layer) 114 are antiparallel in the initial state, the spin torque that acts at first is extremely small. Since the spin torque is small, the magnetization reversal current increases.

A typical phase diagram includes a hysteresis region, a region (a "0" state region) where the memory cell is in a low-resistance state, that is, a "0" state regardless of the initial magnetization state, a region (a "1" state region) where the memory cell is in a high-resistance state, that is, a "1" state regardless of the initial magnetization state, and an unstable operation region where the three regions mentioned above are mixed.

For SpRAM to function as a memory with a sufficient operating margin for actual use, the three regions (the hysteresis region, the "0" state region, and the "1" state region need to be separated sufficiently widely. The hysteresis region can also be referred to as a "bistable operation region". The "0" state region and "1" state region can also be referred to as "monostable operation regions".

Figure 2:
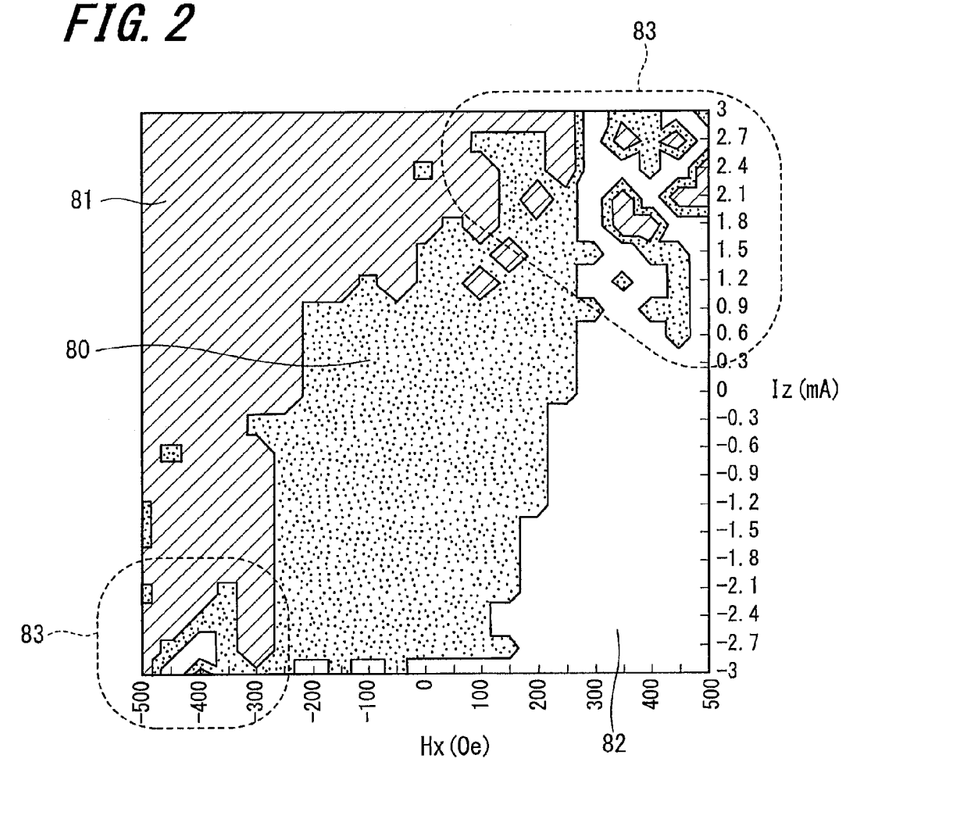
FIG. 2 is a phase diagram for the storage element shown in FIG. 1.

FIG. 2 shows one example of a phase diagram measured for the storage element 101 shown in FIG. 1. FIG. 2 shows the case where the pulse width of the current pulses of the spin injection current Iz is set at 1 ns (nanosecond). The phase diagram shown in FIG. 2 is a state diagram showing the state of the memory cell with the pulse crest value of the spin injection current Iz on the vertical axis and the pulse crest value of the bias current magnetic field Hx on the horizontal axis.

By separating the bistable operation region (the hysteresis region 80) and the monostable operation regions (the "0" state region 81 and the "1" state region 82) in this phase diagram, stable operation becomes possible. As shown in FIG. 2, unstable operation regions 83 where the three states 80, 81, 82 are mixed appear at the upper right (the first quadrant) and the lower left (the third quadrant) corners. When such unstable operation regions 83 exist, the spin injection current Iz and the bias current magnetic field Hx used during a magnetization reversal operation are set so that the unstable operation regions 83 are avoided.

However, since the bistable operation region 80 appears over a wide area in the phase diagram shown in FIG. 2, unless the spin injection current Iz and the bias current magnetic field Hx are increased, the monostable operation regions 81, 82 are not reached. This means that as described earlier, it may be still necessary to increase the magnetization reversal current.

SUMMARY

The present application addresses the above-identified problems and provides a storage element where information can be stably recorded with a small current, and a memory including such storage element.

A storage element according to an embodiment includes: a storage layer that stores information based on a magnetic state of a magnetic material; and a fixed magnetization layer a magnetization direction of which is fixed and which is provided for the storage layer with a nonmagnetic layer in between. In the storage element, information is recorded in the storage layer by applying a current in a stacking direction to change the magnetization direction of the storage layer. The fixed magnetization layer includes a plurality of ferromagnetic layers that are stacked with nonmagnetic layers in between. The fixed magnetization layer includes magnetization regions that have magnetic components in the stacking direction and magnetizations in respectively opposite directions. The regions are formed at both ends of at least one ferromagnetic layer that is disposed closest to the storage layer out of the plurality of ferromagnetic layers.

A memory according to an embodiment includes a storage element and a wiring. The storage element has a storage layer which stores information based on a magnetic state of a magnetic material, where information is recorded in the storage layer by applying a current in a stacking direction to change the magnetization direction of the storage layer. The wiring supplies a current that flows in the stacking direction of the storage element. The storage element is formed as a storage element according to the above-described embodiment.

The storage element according to an embodiment includes a storage layer that stores information based on a magnetic state of a magnetic material. A fixed magnetization layer is provided for the storage layer with a nonmagnetic layer in between, and by applying a current in a stacking direction, the magnetization direction of the storage layer is changed, thereby recording information in the recording layer. Accordingly, by spin injection obtained by applying a current in the stacking direction, it is possible to change the magnetization direction of the storage layer, thereby recording information.

Also, since the fixed magnetization layer is made up of a plurality of ferromagnetic layers stacked with nonmagnetic layers in between, or in other words, since the fixed magnetization layer has a "multiple ferromagnetic layer structure", the magnetization directions of the stacked ferromagnetic layers are respectively different, the opposing magnetic fields cancel each other out, and the strength of the magnetic field that leaks from the fixed magnetization layer to the storage layer can be reduced.

In addition, the fixed magnetization layer includes magnetization regions that have magnetic components in the stacking direction and magnetizations in respectively opposite directions. The regions are formed at both ends of at least the ferromagnetic layer that is disposed closest to the storage layer out of the plurality of ferromagnetic layers (i.e., out of the multiple ferromagnetic layer structure). As a result, two spin torques with different directions act upon the storage layer from the magnetization regions at both ends of the ferromagnetic layer(s) (of the fixed magnetization layer). Hence, it is possible to reverse the magnetization direction of the storage layer using a small current. It also becomes possible to stably carry out switching that changes the magnetization direction regardless of the pulse width of the spin injection current.

The memory according to an embodiment includes a storage element and a wiring. The storage element has a storage layer that stores information based on a magnetic state of a magnetic material, where information is recorded in the storage layer by applying a current in a stacking direction to change the magnetization direction of the storage layer. The wiring supplies a current that flows in the stacking direction of the storage element. The storage element is formed as a storage element according to the embodiment described above. Therefore, information can be recorded by spin injection obtained by applying a current in the stacking direction of the storage element via the wiring.

Further, it is possible to record information using a small current and it is possible to stably record information regardless of the pulse width of the spin injection current.

According to an embodiment described above, it is possible to reverse the magnetization direction of the storage layer, thereby recording information using a small current.

Accordingly, it is possible to reduce the power for recording information and to obtain a memory with low power consumption.

Since it is possible to stably carry out switching regardless of the pulse width of the spin injection current, the margin for the pulse width of the spin injection current is increased. As a result, it is possible to obtain a highly reliable storage element where information can be recorded stably.

Since there is a wider margin for the pulse width, stable operation is possible even when there is slight fluctuation in characteristics between memory cells, so that stable operation is possible even for a large-capacity memory with a large number of memory cells.

That is, according to an embodiment, it is possible to obtain a large-capacity memory that has stable operation.

Additional features and advantages are described herein, and will be apparent from, the following Detailed Description and the figures.

DETAILED DESCRIPTION

The present application will be described in greater detail below according to an embodiment with reference to the figures. In general, a memory that uses spin transfer (i.e., an SpRAM) is provided with sufficiently large anisotropy so that the magnetization of a storage layer (i.e., a free magnetization layer) is stable against heat fluctuations.

The extent to which the magnetization of the storage layer is stable against heat fluctuations as described earlier, that is, the thermostability index can normally be expressed by the thermostability parameter ($\Delta$).

The parameter ($\Delta$) is given as $\Delta = KuV/k_BT$ (Ku: anisotropic energy, V: volume of storage layer, $k_B$: Boltzmann constant, T: absolute temperature).

Since the ferromagnetic layers constituting the fixed magnetization layer are formed thinly in a typical SpRAM, the saturation magnetic field Hs is large. This saturation magnetic field Hs can be expressed as $2 J/(Ms \cdot d)$, where J is the magnitude of the antiferromagnetic coupling in the fixed magnetization layer in which a plurality of ferromagnetic layers are antiferromagnetically coupled and Ms is the saturation magnetization of the respective ferromagnetic layers in the fixed magnetization layer. When the saturation magnetic field Hs is large, the current used to reverse the magnetization direction of the storage layer, or in other words the "magnetization reversal current", may need to be increased.

For a memory (SpRAM) that uses spin transfer, both the achievement to a certain level for the thermostability index (the thermostability parameter) $\Delta$ and the reduction in the magnetization reversal current may be required.

From various research, it was found that a fixed magnetization layer is provided where a plurality of ferromagnetic layers are stacked with nonmagnetic layers in between so as to be antiferromagnetically coupled. In the fixed magnetization layer, magnetization regions, which have magnetization components in the stacking direction and respectively different magnetization directions, are formed at both ends of at least the ferromagnetic layer closest to the storage layer. Accordingly, it is possible to reduce the magnetization reversal current and also to achieve sufficient thermostability, thereby forming a stable memory.

It was found that to form magnetization regions, which have magnetization components in the stacking direction and respectively different magnetization directions, at both ends of the ferromagnetic layer(s) in the fixed magnetization layer, it is effective to form a comparatively thick ferromagnetic layer(s) (for example, sufficiently thicker than the ferromagnetic layers of the storage layer).

Out of the ferromagnetic layers in the fixed magnetization layer, the ferromagnetic layer closest to the storage layer should preferably be at least 2 nm thick. More preferably, each ferromagnetic layer in the fixed magnetization layer should be at least 2 nm thick.

By forming magnetization regions which have magnetization components in the stacking direction and respectively different magnetization directions at both ends of the ferromagnetic layer(s) in the fixed magnetization layer, two spin torques with different directions will act at both ends of the storage layer from the magnetization regions at both ends of the ferromagnetic layer(s).

Since these two spin torques can easily reverse the magnetization direction of the storage layer, it becomes possible to reverse the magnetization direction of the storage layer with a smaller current. It also becomes possible to stably carry out switching that changes the magnetization direction regardless of the pulse width of the spin injection current.

Next, specific embodiments will be described.

Figure 3:
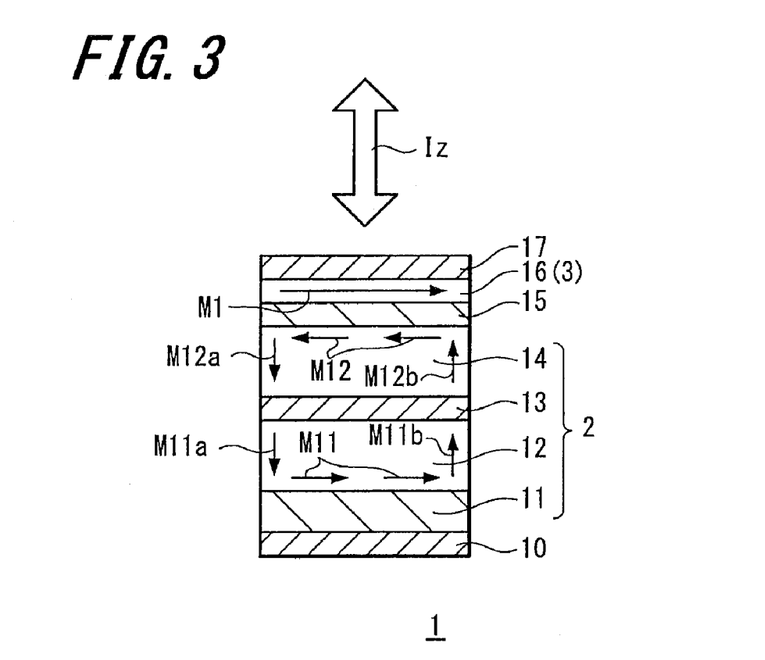
FIG. 3 is a schematic diagram (cross-sectional view) of a storage element according to an embodiment.

FIG. 3 shows a schematic diagram (cross-sectional view) of a storage element as one embodiment of the present invention. This storage element 1 is formed of a TMR (tunnel magnetoresistive effect) element.

By disposing a ferromagnetic layer 12 and a ferromagnetic layer 14 with a nonmagnetic layer 13 in between, the ferromagnetic layers 12, 14 are antiferromagnetically coupled. In addition, the ferromagnetic layer 12 is disposed in contact with an antiferromagnetic layer 11, and due to the exchange interaction that acts between such layers, has strong unidirectional magnetic anisotropy. A fixed magnetization layer 2 is formed of these four layers 11, 12, 13, and 14. That is, the fixed magnetization layer 2 includes two ferromagnetic layers 12, 14.

A ferromagnetic layer 16 is formed so that the direction of the magnetization M1 thereof is comparatively easy to rotate. This ferromagnetic layer 16 constitutes a storage layer (free magnetization layer) 3. A tunnel insulating layer 15 is formed between the ferromagnetic layer 14 and the ferromagnetic layer 16, that is, between the fixed magnetization layer 2 and the storage layer (free magnetization layer) 3. The tunnel insulating layer 15 breaks the magnetic coupling between the magnetic layers 16 and 14 thereabove and therebelow and also transmits a tunnel current. In this way, a TMR (tunnel magnetoresistive effect) element is provided including the fixed magnetization layer 2 that is a magnetic layer with a fixed magnetization direction, the tunnel insulating layer 15, and the storage layer (free magnetization layer) 3 the magnetization direction of which can be changed.

Due to the strong antiferromagnetic coupling via the nonmagnetic layer 13, the magnetization M11 of the ferromagnetic layer 12 and the magnetization M12 of the ferromagnetic layer 14 are antiparallel. The resistance of the TMR element including the layers 14, 15, 16 changes based on whether the direction of magnetization M1 of the ferromagnetic layer 16 of the storage layer 3 and the direction of magnetization M12 of the ferromagnetic layer 14 of the fixed magnetization layer 2 on both sides of the tunnel insulating layer 15 are parallel or antiparallel. When the two magnetizations M1, M12 are parallel, the resistance decreases, while when the magnetizations M1, M12 are antiparallel, the resistance increases. If the resistance of the TMR element (the layers 14, 15, 16) changes, the resistance of the entire storage element 1 will also change. By using such changes, it is possible to record information and to read recorded information. That is, by assigning the low resistance state to "0" information and the high resistance state to "1" information, for example, it is possible to record (one bit of) binary information.

Note that since the ferromagnetic layer 14 that is closest to the storage layer 3 out of the layers in the fixed magnetization layer 2 serves as a reference for the direction of the magnetization M1 of the storage layer 3 when recorded information is read, this ferromagnetic layer 14 is also referred to as the "reference layer".

To rewrite information in a memory cell or to read information that has been recorded in a memory cell, it may be necessary to supply a spin injection current Iz in the stacking direction of the storage element 1.

By changing the polarity of the spin injection current Iz, it is possible to change the spin injection current Iz that flows through the storage element 1 from upward to downward or from downward to upward.

By doing so, it is possible to change the direction of the magnetization M1 of the storage layer 3 of the storage element 1, thereby rewriting the information in the memory cell.

Note that in the same way as the storage element 101 according to the related art shown in FIG. 1, a storage element 1 according to the present embodiment can be formed so as to be connected to a selecting MOS transistor formed in a silicon substrate to allow information to be read from the memory cell.

Further, the storage element 1 is connected to wiring so that the spin injection current Iz can be applied in the stacking direction of the storage element 1 via the wiring.

One characteristic of the storage element 1 according to the present embodiment is that the two ferromagnetic layers 12, 14 of the fixed magnetization layer 2 are sufficiently thick compared to the ferromagnetic layer 16 of the storage layer 3.

As a result, as shown in FIG. 3, in addition to the magnetizations M11, M12 directed in the plane of the film, magnetizations M11$a$, M12$a$ and M11$b$, M12$b$ with magnetization components in the stacking direction are generated at both ends of the two ferromagnetic layers 12, 14 of the fixed magnetization layer 2 to reduce the magnetostatic energy.

The magnetization M11$a$ and magnetization M12$a$ on the left side of FIG. 3 are both downward and the magnetization M11$b$ and magnetization M12$b$ on the right side of FIG. 3 are both upward, and are in substantially opposite directions.

The thickness d of the ferromagnetic layers 12, 14 should preferably be 2 nm or above.

By generating the magnetizations M11$a$, M12$a$ and M11$b$, M12$b$ with magnetization components in the stacking direction as described above, it is possible to raise the vector triple product $M_{free} \times M_{free} \times M_{ref}$ for the magnetization M1 of the storage layer 3 described above in an initial state. Particularly, the result can be raised by the magnetizations M12$a$ and M12$b$ of the ferromagnetic layer (reference layer) 14 which, out of the ferromagnetic layers 12, 14 of the fixed magnetization layer 2, is closest to the storage layer 3

Accordingly, extremely large spin torques are applied to extremely narrow regions of the magnetization M1 of the storage layer 3 that are directly above the magnetizations M12$a$, M12$b$ of the ferromagnetic layer 14.

Figure 4:
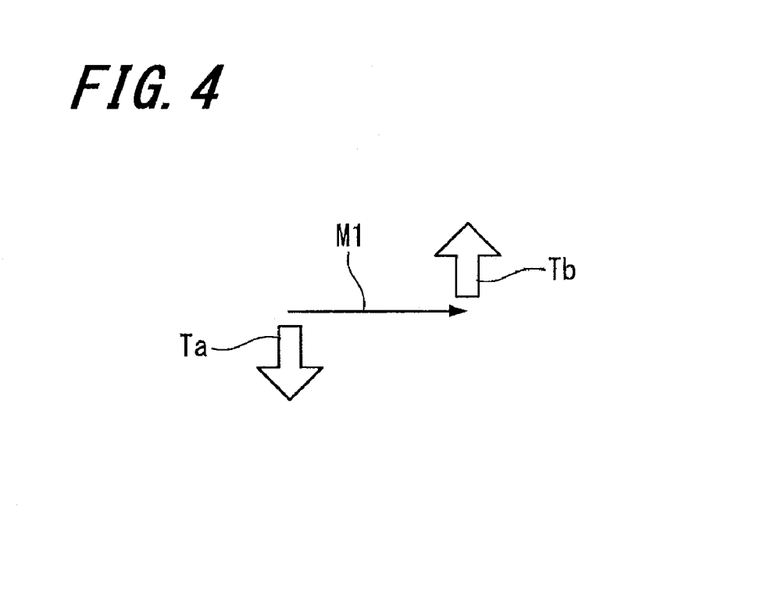
FIG. 4 is a diagram showing spin torques applied to the magnetization of the storage layer shown in FIG. 3.

FIG. 4 shows the state of the spin torques applied to the magnetization M1 of the storage layer 3 in the storage element 1 shown in FIG. 3.

As shown in FIG. 4, spin torques Ta, Tb in opposite directions act upon the magnetization M1 of the storage layer 3 from the magnetizations M12$a$, M12$b$. This is advantageous when rotating the magnetization M1 of the storage layer 3 in a single movement. By doing so, the direction of the magnetization M1 of the storage layer 3 can be reversed easily.

If, for example, the antiferromagnetic coupling J of the ferromagnetic layers 12, 14 is around 1 erg/cm$^2$ and the saturation magnetization Ms of the storage layer 3 (16) is around 1200 emu/cc, the strength of the saturation magnetic field will fall to 8 kOe or below. Here, the expression "saturation magnetic field" refers to the saturation magnetic field applied to make the direction of the magnetization M1 of the storage layer 3 parallel to the direction of the magnetization M12 of the ferromagnetic layer 14 disposed closest to the storage layer 3 out of the ferromagnetic layers of the fixed magnetization layer 2.

Note that depending on the ferromagnetic material that constitutes the ferromagnetic layers 12, 14, there are cases where magnetization components in the stacking direction are generated even when the thickness d is below 2 nm.

According to the present embodiment, magnetizations M11$a$, M12$a$ and M11$b$, M12$b$ with magnetization components in the stacking direction are generated in the ferromagnetic layers 12, 14 of the fixed magnetization layer 2. However, control over the direction of magnetization M1 of the storage layer 3 can be carried out based on the direction (polarity) of the spin injection current Iz in the same way as with the storage element 101 shown in FIG. 1.

Note that although the angle between the magnetization M11$a$ and the magnetization M12$a$ on the left side and the magnetization M11$b$ and the magnetization M12$b$ on the right side is substantially 180° in FIG. 3, it is possible to control the angle via the thickness d of the ferromagnetic layers 12, 14 and the strength of the saturation magnetization.

Even if this angle is not nearly 180° as shown in FIG. 3, it is possible to easily reverse the direction of the magnetization M1 of the storage layer 3 by applying spin torques with different directions to the magnetization M1 of the storage layer 3.

In the present embodiment, the same materials as a typical storage element can be used as the materials of the various layers that constitute the storage element 1.

As one example, PtMn can be used as the material of the antiferromagnetic layer 11.

A ferromagnetic material such as CoFe can be used as the material of the ferromagnetic layers 12, 14 of the fixed magnetization layer 2.

As examples, Ru, Ta, Cr, Cu, and the like can be used as the material of the nonmagnetic layer 13.

As one example, MgO can be used as the material of the tunnel insulating layer 15.

A ferromagnetic material such as CoFeB can be used as the material of the ferromagnetic layer 16 of the storage layer 3.

Figure 5:
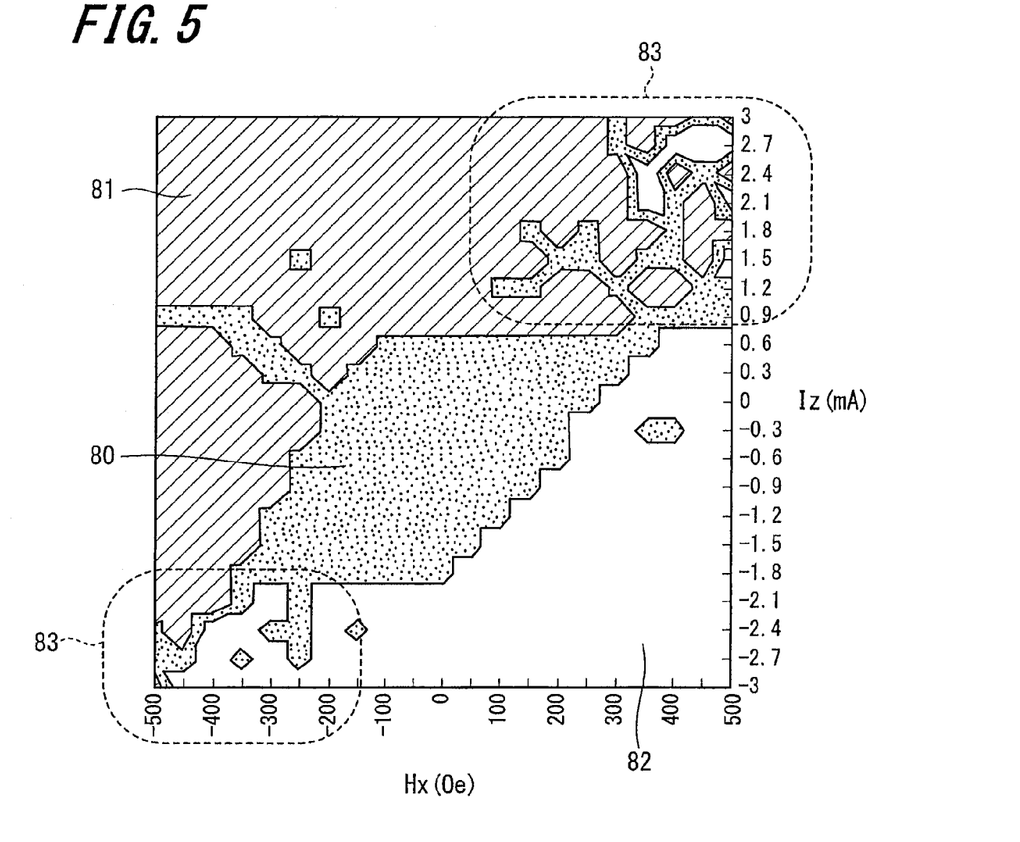
FIG. 5 is a phase diagram for the storage element shown in FIG. 3.

FIG. 5 shows one example of a phase diagram that has been measured for the storage element 1 according to the present embodiment. The pulse width of the current pulses of the spin injection current Iz is set at ins (nanosecond).

The phase diagram shown in FIG. 5 is a state diagram showing the state of a memory cell with the pulse crest value of the spin injection current Iz on the vertical axis and the pulse crest value of the bias current magnetic field Hx on the horizontal axis. Note that although the storage element 1 shown in FIG. 3 is not formed to apply the bias current magnetic field Hx, a construction where the bias current magnetic field Hx is applied to the storage element 1 was used to generate this phase diagram.

As shown in FIG. 5, unstable operation regions 83 appear at the top right and bottom left. However, since the bistable operation region 80 and the monostable operation regions 81, 82 are clearly separated, stable operation can be achieved by setting the directions and the magnitudes of the spin injection current Iz and the bias current magnetic field Hx so as to avoid the unstable operation regions 83.

In addition, since the bistable operation region 80 and the monostable operation regions 81, 82 are clearly separated even when the bias current magnetic field Hx=0, it is possible to stably carry out magnetization reversal without applying a bias current magnetic field Hx.

According to the above-described storage element 1 of the present embodiment, the ferromagnetic layers 12, 14 of the fixed magnetization layer 2 are sufficiently thick. As a result, the ferromagnetic layers 12, 14 have magnetization components in the stacking direction at both ends thereof, thereby generating the magnetizations M11a, M12a and M11b, M12b in opposite directions. Accordingly, it is possible to cause large spin torques Ta, Tb with opposite directions to act upon both ends of the magnetization M1 of the storage layer 3.

Since the direction of the magnetization M1 of the storage layer 3 can be easily reversed in this way, it is possible to reverse the direction of the magnetization M1 using a spin injection current Iz of a smaller magnitude.

By doing so, the spin injection current Iz for recording information can be reduced, thereby reducing power consumption.

For example, for a storage element 1 constructed so that the thermostability index Δ=60, even if the pulse width of the spin injection current Iz is comparatively long at 1 ns (nanosecond), magnetization reversal is possible with a small current of 0.3 mA or below.

On the other hand, for the storage element 101 according to the related art with the construction shown in FIG. 1, if the element is constructed so that the thermostability index Δ is 60, a current of 2 mA or above may be required to reverse the magnetization with a pulse width 1 ns.

With the storage element 1 according to the present embodiment, since it is possible for large spin torques Ta, Tb with opposite directions to act on both ends of the magnetization M1 of the storage layer 3, it is possible to carry out switching stably regardless of the pulse width of the spin injection current Iz.

Accordingly, it is possible to obtain a highly reliable storage element 1 where information can be recorded stably.

Since there is a wider margin for the pulse width of the spin injection current Iz, stable operation is possible even when there is slight fluctuation in characteristics between memory cells, so that stable operation is possible even for a large-capacity memory with a large number of memory cells.

Accordingly, by constructing a memory with a large number of memory cells each including the storage element 1 shown in FIG. 3, it is possible to obtain a large-capacity memory that has low power consumption and stable operation.

Also, as shown in the phase diagram in FIG. 5, it is possible to stably reverse the magnetization even without applying a bias current magnetic field Hx.

Therefore, since the construction of memory cells including the storage elements 1 can be simplified as compared to a construction where the bias current magnetic field Hx is applied, the memory cells can be miniaturized, which makes it possible to miniaturize the memory and/or increase the storage capacity.

Since the fixed magnetization layer 2 is formed below the storage layer 3 in the storage element 1 according to the present embodiment described above, the magnetization regions with the magnetization components in the stacking direction of the reference layer 14 will be disposed below the storage layer 3. However, it is also possible to use a construction where the fixed magnetization layer is formed above the storage layer and the magnetization regions are disposed above the storage layer.

Figure 6:
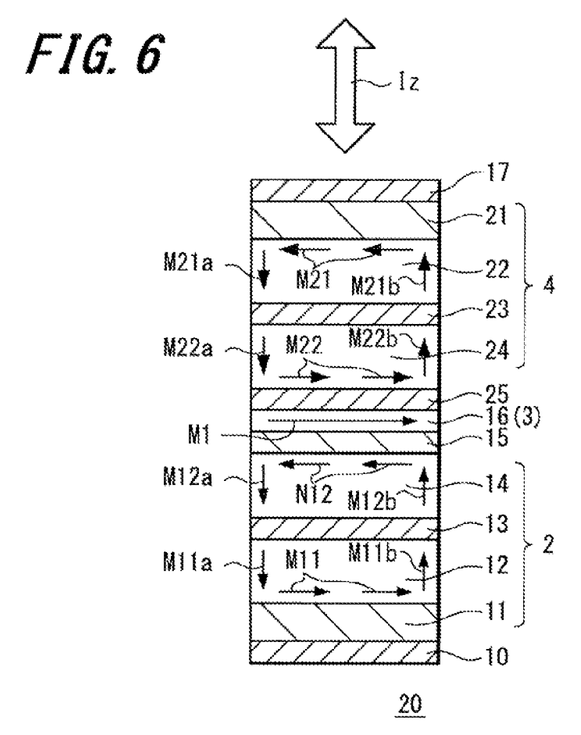
FIG. 6 is a schematic diagram (cross-sectional view) of a storage element according to another embodiment.

Next, FIG. 6 shows a schematic diagram (cross-sectional view) of a storage element according to another embodiment.

A storage element 20 according to the present embodiment includes, in addition to the construction of the storage element 1 of the embodiment described earlier, another fixed magnetization layer 4 between the storage layer 3 (16) and a cap layer 17, that is, above the storage layer 3 (16) and also includes a tunnel insulating layer 25 between the storage layer 3 and the fixed magnetization layer 4. That is, the storage element 20 has a "dual-tunnel" construction.

The fixed magnetization layer 4 above the storage layer 3 (16) includes an antiferromagnetic layer 21, a ferromagnetic layer 22, a nonmagnetic layer 23, and a ferromagnetic layer 24 in that order from the top.

In the same manner as in the lower fixed magnetization layer 2, the two ferromagnetic layers 22, 24 of the upper fixed magnetization layer 4 are formed sufficiently thicker than the ferromagnetic layer 16 of the storage layer 3, so that magnetizations M21a, M22a and M21b, M22b with magnetization components in the stacking direction are generated in the ferromagnetic layers 22, 24.

The direction of the magnetization M22 of the ferromagnetic layer 24 of the upper fixed magnetization layer 4 is rightward, which is the opposite of the direction of the magnetization M12 of the ferromagnetic layer (reference layer) 14 of the lower fixed magnetization layer 2. This ferromagnetic layer 24 of the upper fixed magnetization layer 4 is also a reference layer.

A magnetization loop is counterclockwise in the upper fixed magnetization layer 4 and is counterclockwise in the lower fixed magnetization layer 2 and therefore the loops are in the same direction.

In the same manner as with the ferromagnetic layer (reference layer) 14 of the lower fixed magnetization layer 2, it is possible to apply large spin torques in opposite directions to both ends of the storage layer 3 from the ferromagnetic layer (reference layer) 24 of the upper fixed magnetization layer 4.

In particular, in the ferromagnetic layer (reference layer) 14 of the lower fixed magnetization layer 2 and the ferromagnetic layer (reference layer) 24 of the upper fixed magnetization layer 4, the magnetizations M12a, M22a at the left end in FIG. 6 are both downward and the magnetizations M12b, M22b at the right end are both upward. Therefore, spin torques in the same direction are applied from the ferromagnetic layers (reference layers) 14, 24 to the left end and the right end of the storage layer 3.

Accordingly, large spin torques that are strengthened in the same directions are applied to both ends of the storage layer 3 from the lower ferromagnetic layer (reference layer) 14 and the upper ferromagnetic layer (reference layer) 24. Therefore, the direction of the magnetization M1 of the storage layer 3 can be reversed even more easily than for the storage element 1 of the embodiment described earlier.

According to the storage element 20 having the above-described construction of the present embodiment, in the same manner as the storage element 1 of the embodiment described earlier, it is possible for large spin torques to act on both ends of the magnetization M1 of the storage layer 3.

Accordingly, since it is possible to easily reverse the direction of the magnetization M1 of the storage layer 3, the magnetization M1 of the storage layer 3 can be reversed with a spin injection current Iz of small magnitude. It is therefore possible to reduce the spin injection current Iz for recording information and to reduce the power consumption.

Since it is possible to stably carry out switching regardless of the pulse width of the spin injection current Iz, there is a wide margin for the pulse width for the spin injection current Iz, and therefore stable operation is possible even when there is slight fluctuation in the characteristics between memory cells. Hence, stable operation can be carried out even for a large-capacity memory with a large number of memory cells.

Accordingly, by constructing a memory with a large number of memory cells each including the storage element 20 shown in FIG. 6, it is possible to obtain a large-capacity memory that has low power consumption and stable operation.

In particular, large spin torques can be applied to both ends of the storage layer 3 from both the ferromagnetic layer (reference layer) 14 of the lower fixed magnetization layer 2 and the ferromagnetic layer (reference layer) 24 of the upper fixed magnetization layer 4 in the storage element 20 of the present embodiment. Therefore, the magnetization of the storage layer 3 can be reversed even more easily as compared to the storage element 1 of the embodiment described earlier.

Accordingly, it is possible to further reduce the spin injection current Iz compared to the storage element 1 of the embodiment described earlier.

Note that even if the upper part of the construction of the storage element 20 shown in FIG. 6 is changed to a GMR element by providing a nonmagnetic intermediate layer in place of the tunnel insulating layer 25, the same effects in addition to the MR ratio may be obtained.

With this construction, since the direction of the magnetization M22 of the ferromagnetic layer 24 of the above fixed magnetization layer 4 can be freely chosen, it is also possible to omit the antiferromagnetic layer 21.

Figure 7:
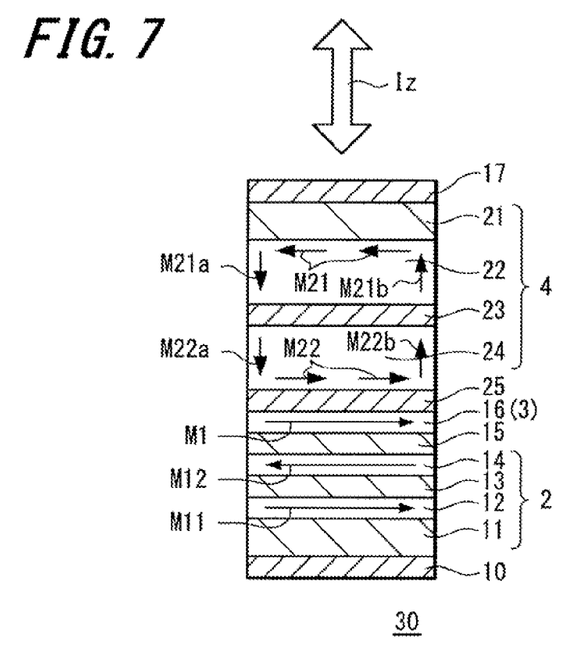
FIG. 7 is a schematic diagram (cross-sectional view) of a storage element according to yet another embodiment.

Next, FIG. 7 shows a schematic diagram (cross-sectional view) of a storage element as yet another embodiment of the present invention.

Although the above fixed magnetization layer 4 has the same construction as in the storage element 20 shown in FIG. 6, a storage element 30 of the present embodiment includes the lower fixed magnetization layer 2 that is formed of thin ferromagnetic layers 12, 14 as in the storage element 101 shown in FIG. 1.

According to the storage element 30 of the present embodiment, it is possible to apply spin torques with opposite directions to both ends of the storage layer 3 from the ferromagnetic layer (reference layer) 24 of the upper fixed magnetization layer 4, in the same way as with the storage element 1 of the embodiment described earlier. Therefore, the direction of the magnetization M1 of the storage layer 3 can be reversed easily.

Accordingly, it is possible to reverse the direction of the magnetization M1 of the storage layer 3 using a spin injection current Iz of a small magnitude. Hence, the spin injection current Iz for recording information can be reduced, resulting in a reduction in power consumption. It is also possible to stably carry out switching regardless of the pulse width of the spin injection current Iz.

According to the storage element 30 of the present embodiment, the lower fixed magnetization layer 2 is constructed in the same manner as the storage element 101 in FIG. 1 by forming the thin ferromagnetic layers 12, 14 so that magnetization components in the stacking direction are not generated. Therefore, by appropriately selecting the materials and thicknesses of the layers 12, 13, 14 of the lower fixed magnetization layer 2, it is possible to optimize the MR ratio (i.e., the rate of change of magnetoresistance).

As a result, the storage element 30 can be separated into the lower fixed magnetization layer 2 that optimizes the MR ratio and the upper fixed magnetization layer 4 that optimizes the magnetization reversal current. Consequently, by controlling the respective constructions of the fixed magnetization layers 2, 4, it is possible to optimize the MR ratio and the magnetization reversal current.

Accordingly, the materials of the layers 12, 13, 14 of the lower fixed magnetization layer 2 and the thickness of the nonmagnetic layer 13 may be set differently to the upper fixed magnetization layer 4 to optimize the MR ratio and the magnetization reversal current. Also, although in the storage element 30 shown in FIG. 7, the lower fixed magnetization layer 2 is constructed from two ferromagnetic layers 12, 14, that is, the same number of ferromagnetic layers as the upper fixed magnetization layer 4, the fixed magnetization layer 2 may have a different number of ferromagnetic layers to the fixed magnetization layer 4.

Note that even if the upper part of the construction of the storage element 30 shown in FIG. 7 is changed to a GMR element by providing a nonmagnetic intermediate layer in place of the upper tunnel insulating layer 25, the same effects in addition to the MR ratio can be obtained.

With this construction, since the direction of the magnetization M22 of the ferromagnetic layer 24 of the upper fixed magnetization layer 4 can be optionally chosen, it is also possible to omit the antiferromagnetic layer 21.

Also, even if the lower part of the construction of the storage element 30 shown in FIG. 7 is changed to a GMR element by providing a nonmagnetic intermediate layer in place of the lower tunnel insulating layer 15, the same effects in addition to the MR ratio can be obtained.

However, to achieve a suitable MR ratio, a tunnel insulating layer is used as at least one out of the lower intermediate layer and the upper intermediate layer.

In addition, the storage element 30 shown in FIG. 7 includes the upper fixed magnetization layer 4 that is constructed according to the present embodiment. However, it is also possible to construct the lower fixed magnetization layer according to the present embodiment to obtain a construction where magnetization components in the stacking direction are not generated in the upper fixed magnetization layer, that is, to use the opposite construction in the vertical plane to the construction shown in FIG. 7.

In the embodiments described above, the fixed magnetization layers 2, 4 are respectively constructed of two ferromagnetic layers 12, 14 and 22, 24 that are stacked with nonmagnetic layers 13, 23 in between. However, the fixed magnetization layers according to an embodiment of the present invention may be formed of three or more ferromagnetic layers that are stacked with nonmagnetic layers in between.

Figure 8:
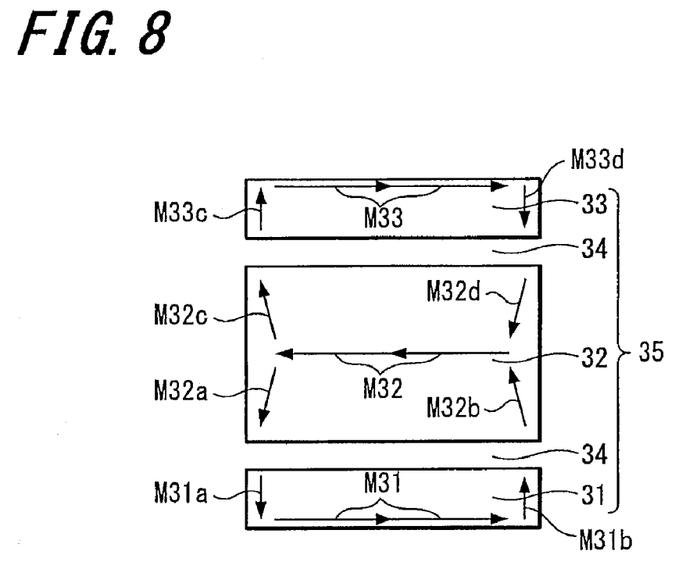
FIG. 8 is a schematic cross-sectional view showing a fixed magnetization layer including three ferromagnetic layers.

FIG. 8 shows a schematic cross-sectional view of the magnetization state when the fixed magnetization layer is constructed of three ferromagnetic layers.

As shown in FIG. 8, a fixed magnetization layer 35 is formed of three ferromagnetic layers 31, 32, 33 that are stacked with nonmagnetic layers 34 in between. By setting the thickness of the middle ferromagnetic layer 32 at approximately double the thickness of the lower ferromagnetic layer 31 and the upper ferromagnetic layer 33, it is possible to almost completely eliminate a leaked magnetic field from the entire fixed magnetization layer 35.

In the lowermost ferromagnetic layer 31, in addition to the rightward magnetization M31, magnetizations M31a and M31b with magnetization components in the stacking direction are generated at both ends.

In the uppermost ferromagnetic layer 33, in addition to the rightward magnetization M33, magnetizations M33c and M33d with magnetization components in the stacking direction are generated at both ends.

In the middle ferromagnetic layer 32, in addition to the leftward magnetization M32, magnetizations M32a, M32b, M32c, M32d with magnetization components in the stacking direction are generated at both ends. Such magnetizations correspond to the magnetizations M31a, M31b of the lower ferromagnetic layer 31 and the magnetizations M33c, M33d of the upper ferromagnetic layer 33 and have magnetization components in the stacking direction with the same orientations as such magnetizations in the other ferromagnetic layers.

Such magnetization forms a clockwise magnetic field loop in the upper half of the fixed magnetization layer 35 and a counterclockwise magnetic field loop in the lower half of the fixed magnetization layer 35.

In the case where the storage layer is disposed above the ferromagnetic layer 33, for example, a large upward spin torque is applied to the left end of the magnetization of the storage layer and a large downward spin torque is applied to the right end.

Note that in the case of two ferromagnetic layers included in the fixed magnetization layer, it may be necessary to form both ferromagnetic layers thickly to substantially eliminate a leaked magnetic field. However, the thickness d may not be equal for all layers and the leaked magnetic field can be reduced by making the ferromagnetic layer closest to the storage layer slightly thinner than the other ferromagnetic layer.

On the other hand, if there are three or more ferromagnetic layers in the fixed magnetization layer, it may still be possible to obtain the effect according to an embodiment of the present invention even when magnetization components in the stacking direction are not generated in ferromagnetic layers that are away from the storage layer.

For example, as a modification to the three layer construction shown in FIG. 8, it is possible to form the lowest ferromagnetic layer 31 thinly so that magnetization components in the stacking direction may not be generated in the lower loop.

That is, the effect according to an embodiment can be obtained if magnetization components in the stacking direction are generated in at least the closest ferromagnetic layer to the storage layer (i.e., in the reference layer) out of the plurality of ferromagnetic layers in the fixed magnetization layer.

The leaked magnetic field may be reduced by adjusting the overall balance between the three or more ferromagnetic layers.

Although the storage layer 3 is formed of a single ferromagnetic layer 16 in the embodiments described above, according to an embodiment of the present invention, the storage layer may be formed of a plurality of ferromagnetic layers that are ferromagnetically coupled or antiferromagnetically coupled. A construction where a plurality of ferromagnetic layers are stacked with nonmagnetic layers in between and a construction where a plurality of ferromagnetic layers are directly stacked (in this case, the adjacent ferromagnetic layers have different materials or compositions) may be provided.

Also, the magnetization directions of the ferromagnetic layers of the fixed magnetization layers 2, 4 are fixed by the antiferromagnetic layers 11, 21 in the embodiments described above. However, according to an embodiment, a construction where the magnetization directions of the fixed magnetization layers are fixed without providing antiferromagnetic layers or a construction where the magnetization directions of the fixed magnetization layers are fixed by stacking a hard magnetic layer and a ferromagnetic layer may also be used.

Note that in the embodiments described above, by forming the thick ferromagnetic layers of the fixed magnetization layers, magnetization regions with magnetization components in the stacking direction are formed in the ferromagnetic layers at any time.

It is believed that the effect according to an embodiment (i.e., the ability to record information with a smaller current) can also be obtained with different constructions to those described above.

For example, there may be used a construction where magnetization regions with magnetization components in the stacking direction are formed in a ferromagnetic layer of a fixed magnetization layer by a magnetic field applied from a magnetic field applying device (for example, a hard magnetic layer) provided outside the fixed magnetization layer.

As another example, there may be used a construction where a storage element is driven so that magnetization regions with magnetization components in the stacking direction are formed in a ferromagnetic layer of the fixed magnetization layer during the information recording process and magnetization regions with magnetization components in the stacking direction are not formed during other processes (for example, a reading process) or while recorded information is being stored.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage element comprising:
   a storage layer that stores information based on a magnetic state of a magnetic material; and
   a fixed magnetization layer a magnetization direction of which is fixed and which is provided for the storage layer with a nonmagnetic layer in between, wherein
   information is recorded in the storage layer by applying a current in a stacking direction to change the magnetization direction of the storage layer,
   the fixed magnetization layer includes a plurality of ferromagnetic layers that are stacked with nonmagnetic layers in between, and
   the fixed magnetization layer includes magnetization regions having magnetic components in the stacking direction and magnetizations in respectively opposite directions, the magnetization regions being formed at both ends of at least one ferromagnetic layer that is disposed closest to the storage layer out of the plurality of ferromagnetic layers.

2. A storage element according to claim 1, wherein each ferromagnetic layer that forms the fixed magnetization layer has a thickness of at least 2 nm.

3. A storage element according to claim 1, wherein a magnitude of a saturation magnetic field of the fixed magnetization layer applied to make the magnetization direction of the storage layer parallel to the magnetization direction of the ferromagnetic layer disposed closest to the storage layer out of the plurality of ferromagnetic layers is 8kOe or below.

4. A storage element according to claim 1, wherein the fixed magnetization layer includes a lower fixed magnetization layer provided below the storage layer and an upper fixed magnetization layer provided above the storage layer and the at least one ferromagnetic layer having the magnetization regions is included in at least one of the lower fixed magnetization layer and the upper fixed magnetization layer.

5. A memory comprising:
   a storage element including a storage layer that stores information based on a magnetic state of a magnetic material and a fixed magnetization layer a magnetization direction of which is fixed and which is provided for the storage layer with a nonmagnetic layer in between, in which information is recorded in the storage layer by applying a current in a stacking direction to change the magnetization direction of the storage layer; and
   wiring that supplies a current flowing in the stacking direction of the storage element, wherein
   the fixed magnetization layer of the storage element includes a plurality of ferromagnetic layers that are stacked with nonmagnetic layers in between, and
   the fixed magnetization layer includes magnetization regions having magnetic components in the stacking direction and magnetizations in respectively opposite directions, the magnetization regions being formed at both ends of at least one ferromagnetic layer that is disposed closest to the storage layer out of the plurality of ferromagnetic layers.

* * * * *